(12) United States Patent
Gu et al.

(10) Patent No.: US 12,713,976 B2
(45) **Date of Patent: *Aug. 18, 2026**

(54) HBM SILICON PHOTONIC TSV ARCHITECTURE FOR LOOKUP COMPUTING AI ACCELERATOR

(71) Applicant: Samsung Electronics Co., Ltd., Suwon-si (KR)

(72) Inventors: Peng Gu, Santa Barbara, CA (US); Krishna Malladi, San Jose, CA (US); Hongzhong Zheng, Los Gatos, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 919 days.

This patent is subject to a terminal disclaimer.

(21) Appl. No.: 17/873,120

(22) Filed: Jul. 25, 2022

(65) Prior Publication Data

US 2022/0367412 A1 Nov. 17, 2022

Related U.S. Application Data

(63) Continuation of application No. 15/911,063, filed on Mar. 2, 2018, now Pat. No. 11,398,453.

(Continued)

(51) Int. Cl.

*H10W 90/00* (2026.01)
*G02F 1/01* (2006.01)

(Continued)

(52) U.S. Cl.

CPC ............ *H10W 90/00* (2026.01); *G02F 1/011* (2013.01); *H04B 10/801* (2013.01);

(Continued)

(58) Field of Classification Search

CPC ................ H01L 25/0652; H01L 25/18; H01L 2225/06513; H01L 2225/06517;

(Continued)

(56) References Cited

U.S. PATENT DOCUMENTS 6,070,262 A 5/2000 Kellogg et al.
6,449,692 B1 9/2002 Krueger et al.

(Continued)

FOREIGN PATENT DOCUMENTS

CN 105635861 A 6/2016
CN 105703765 A 6/2016

(Continued)

OTHER PUBLICATIONS

Advisory Action for U.S. Appl. No. 15/911,063, mailed Aug. 2, 2021.

(Continued)

*Primary Examiner* — Ratisha Mehta
*Assistant Examiner* — Sophia W Kao
(74) *Attorney, Agent, or Firm* — Renaissance IP Law Group LLP

(57) ABSTRACT

According to one general aspect, an apparatus may include a memory circuit die configured to store a lookup table that converts first data to second data. The apparatus may also include a logic circuit die comprising combinatorial logic circuits configured to receive the second data. The apparatus may further include an optical via coupled between the memory circuit die and the logical circuit die and configured to transfer second data between the memory circuit die and the logic circuit die.

7 Claims, 7 Drawing Sheets

Related U.S. Application Data

(60) Provisional application No. 62/615,295, filed on Jan. 9, 2018.

(51) Int. Cl.
*H04B 10/80* (2013.01)
*H04Q 11/00* (2006.01)
*H10F 55/00* (2025.01)
*H10F 77/00* (2025.01)
*H10F 77/40* (2025.01)
*H10W 90/20* (2026.01)

(52) U.S. Cl.
CPC ......... *H04Q 11/0071* (2013.01); *H10F 55/00* (2025.01); *H10F 77/413* (2025.01); *H10F 77/93* (2025.01); *H04Q 2011/0073* (2013.01); *H04Q 2011/0081* (2013.01); *H10W 90/295* (2026.01); *H10W 90/297* (2026.01); *H10W 90/722* (2026.01); *H10W 90/724* (2026.01)

(58) Field of Classification Search
CPC . H01L 2225/06534; H01L 2225/06541; G02F 1/011; H04B 10/801; H04Q 11/0071; H04Q 2011/0073; H04Q 2011/0081; H10F 55/00; H10F 77/413; H10F 77/93; G06F 15/7867; G11C 5/06; G11C 5/025; G11C 13/04; G11C 2213/71
See application file for complete search history.

(56) References Cited

U.S. PATENT DOCUMENTS 7,373,033 B2 5/2008 Lu et al.
7,532,785 B1 5/2009 Beausoleil et al.
7,675,949 B2 3/2010 Bartley et al.
7,773,447 B2 8/2010 Kajigaya
7,966,444 B2 6/2011 Lee et al.
8,059,443 B2 11/2011 McLaren et al.
8,267,583 B2 9/2012 Yao et al.
8,295,655 B2 10/2012 Manipatruni et al.
8,335,434 B2 12/2012 Beausoleil et al.
9,002,147 B2 4/2015 Akiyama
9,094,135 B2 7/2015 Pelley et al.
9,297,971 B2 3/2016 Thacker et al.
9,299,423 B2 3/2016 Baker et al.
9,432,298 B1 8/2016 Smith
9,449,653 B2 9/2016 Kim et al.
9,503,095 B2 11/2016 Gao et al.
9,666,562 B2 5/2017 Law et al.
11,398,453 B2 * 7/2022 Gu .......................... H10F 77/93
2008/0162856 A1 7/2008 Chai et al.
2014/0181331 A1 6/2014 Ware et al.
2014/0193115 A1 7/2014 Popovic
2014/0244981 A1 8/2014 Okada
2014/0268980 A1 * 9/2014 Kim ....................... G11C 5/025 438/69
2014/0270621 A1 9/2014 Dutt et al.
2014/0270629 A1 9/2014 Dutt et al.
2014/0355327 A1 12/2014 Byun et al.
2014/0363172 A1 12/2014 Pelley et al.
2016/0173101 A1 * 6/2016 Gao ........................ H01L 25/18 438/107
2016/0196863 A1 7/2016 Shin et al.
2017/0186770 A1 6/2017 Or-Bach et al.
2017/0237440 A1 8/2017 Zhang et al.
2017/0317055 A1 11/2017 Emma et al.
2017/0323041 A1 * 11/2017 Zhang ..................... G06F 30/33
2017/0323042 A1 11/2017 Zhang

FOREIGN PATENT DOCUMENTS

EP 2212887 B1 4/2013
JP 2006084766 A 3/2006
JP 2008112508 A 5/2008
JP 2016123092 A 7/2016
KR 20100095515 A 8/2010
KR 20140112818 A 9/2014
TW 201636627 A 10/2016

OTHER PUBLICATIONS

Dong, Xiangyu et al., "NVSim: A Circuit-Level Performance, Energy, and Area Model for Emerging Nonvolatile Memory", IEEE Transactions on Computer-Aided Design of Integrated Circuits and Systems, vol. 31, No. 7, Jul. 2012.
Final Office Action for U.S. Appl. No. 15/911,063, mailed Apr. 28, 2021.
Final Office Action for U.S. Appl. No. 15/911,063, mailed Dec. 23, 2021.
Grani, Paolo et al, "Design and Evaluation of AWGR-Based Photonic NoC Architectures for 2.5D Integrated High Performance Computing Systems," 2017 IEEE International Symposium on High Performance Computer Architecture (HPCA), 2017.
Ho, Ron et al., "Silicon Photonic Interconnects for Large-Scale Computer Systems," IEEE Micro, vol. 33, Issue 1, 2013, 11 pages.
Lee, Jong Chem et al., "High Bandwidth Memory(HBM) with TSV Technique" 2016 International SoC Design Conference (ISOCC), 2016.
Notice of Allowance for U.S. Appl. No. 15/911,063, mailed Mar. 23, 2022.
Office Action for U.S. Appl. No. 15/911,063, mailed Oct. 16, 2020.
Office Action for U.S. Appl. No. 15/911,063, mailed Oct. 7, 2019.
Office Action for U.S. Appl. No. 15/911,063, mailed Sep. 2, 2021.
Quayle Office Action for U.S. Appl. No. 15/911,063, mailed Apr. 15, 2020.
Udipi, Aniruddha N. et al., "Combining Memory and a Controller with Photonics through 3D-Stacking to Enable Scalable and Energy-Efficient Systems," 2011 38th Annual International Symposium on Computer Architecture (ISCA), San Jose, CA, 2011, 12 pages.
Wikipedia, "High Bandwidth Memory", https://en.wikipedia.org/wiki/High_Bandwidth_Memory, Accessed Feb. 9, 2018.
Xie, Yuan et al., "Three-dimensional Integrated Circuits: Design, EDA, and Architecture", Foundations and Trends® in Electronic Design Automation. vol. 5. Issue 1-2, Sep. 25, 2011.

* cited by examiner 100
104 Processor
116 Config Inf
118 I/O Inf
112 Processing Element (RLUT)
114 Random Access Memory
Reconfigurable Memory Logic102
108 Other Components
106 Memory

Memory 216

LUT 214 input 222 output 224 vias 226

RAM 204

Logic 202

CLB 212

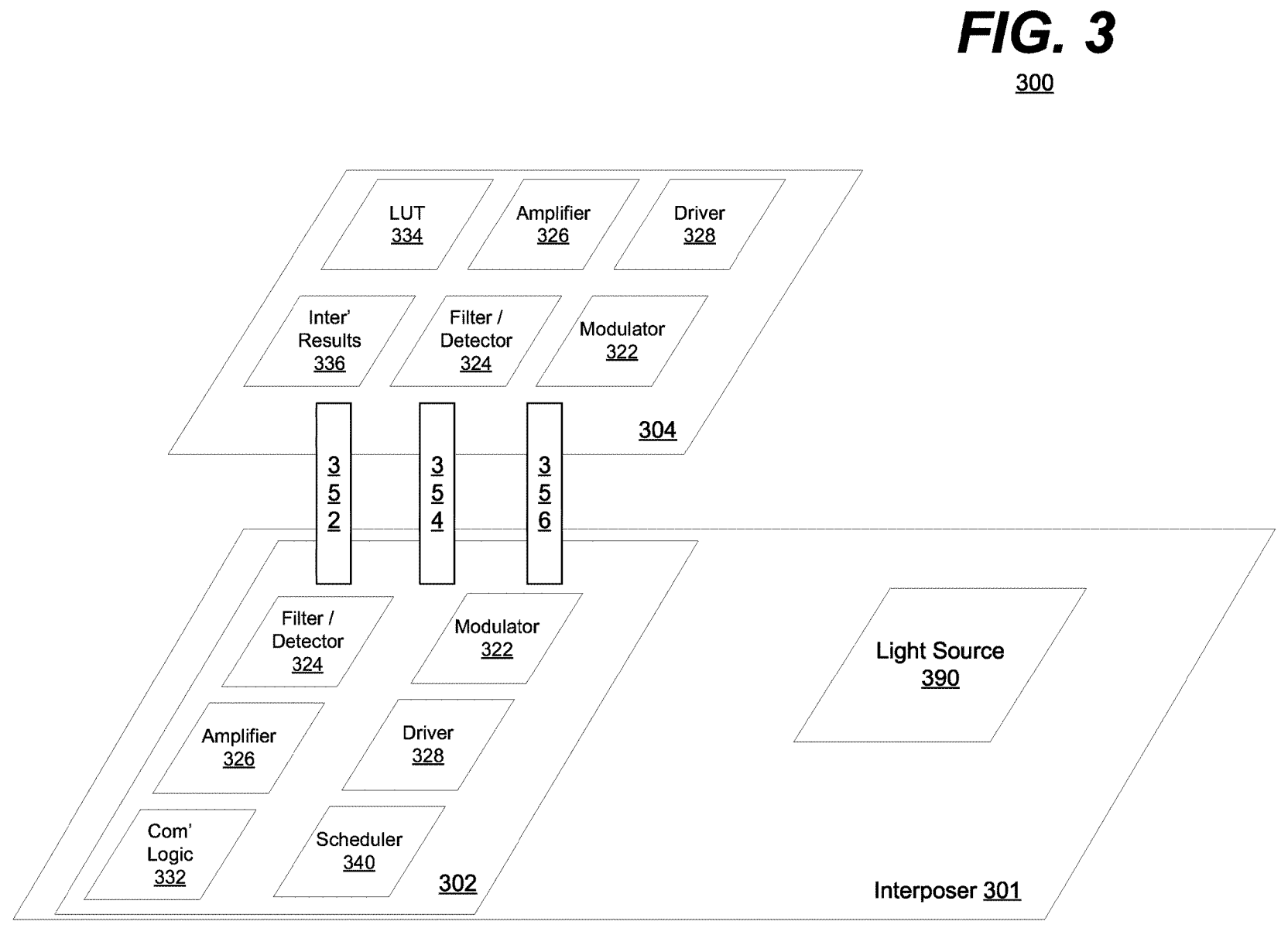

FIG. 3
300

Light Source 390
Interposer 301
304
Driver 328
Amplifier 326
LUT 334
Modulator 322
Filter / Detector 324
Inter' Results 336
356
354
352
302
Modulator 322
Driver 328
Scheduler 340
Filter / Detector 324
Amplifier 326
Com' Logic 332

490
490
Disconnected mats 434
490
490
Coupled mats 432
Buffer 416
Serializer 414
Electrical Driver 412
Light Source 406
λ1
λ2
λ3
λ4
404
Waveguide 402

500
505
510
NON-VOLATILE MEMORY 530
PROCESSOR AND/OR LOGIC
515
CLB
VOLATILE MEMORY 520
NETWORK INTERFACE 540
USER INTERFACE UNIT 550
OTHER HARDWARE DEVICES 560
SOFTWARE 570

HBM SILICON PHOTONIC TSV ARCHITECTURE FOR LOOKUP COMPUTING AI ACCELERATOR

CROSS-REFERENCE TO RELATED APPLICATION

This application is a continuation of U.S. patent application Ser. No. 15/911,063, filed Mar. 2, 2018, which claims priority under 35 U.S.C. § 119 to U.S. Provisional Patent Application Ser. No. 62/615,295, filed Jan. 9, 2018. The subject matter of these earlier filed applications are hereby incorporated by reference.

TECHNICAL FIELD

This description relates to computing technology, and more specifically to high-bandwidth memory (HBM) silicon photonic through-silicon-via (TSV) architecture for lookup computing artificial intelligence (AI) accelerator.

BACKGROUND

High Bandwidth Memory (HBM) is a high-performance RAM interface for 3D-stacked dynamic random access memory (DRAM). It may be used in conjunction with high-performance graphics accelerators and network devices. High Bandwidth Memory has been adopted by the Joint Electron Device Engineering Council (JEDEC) as an industry standard in October 2013. The second generation, HBM2, was accepted by JEDEC in January 2016.

HBM achieves higher bandwidth while using less power in a substantially smaller form factor than traditional system or graphical memories. This is achieved by stacking up to eight DRAM dies, including an optional base die with a memory controller, which are interconnected by through-silicon vias (TSV) and micro-bumps. HBM2 is able to reach 256 GB/s memory bandwidth per package.

HBM may be used with neural network or other AI training, which is both memory intensive and computation heavy. This is due to the increase in training data set size, and increase in model parameters, and an increase in the intermediate results of the processing.

SUMMARY

According to one general aspect, an apparatus may include a memory circuit die configured to store a lookup table that converts first data to second data. The apparatus may also include a logic circuit die comprising combinatorial logic circuits configured to receive the second data. The apparatus may further include an optical via coupled between the memory circuit die and the logical circuit die and configured to transfer second data between the memory circuit die and the logic circuit die.

According to another general aspect, an apparatus may include a first circuit die configured to store a reconfigurable logic circuit. The apparatus may include a second circuit die comprising fixed logic circuits. The apparatus may further include an optical link coupled between the first circuit die and the second circuit die, and configured to transfer data between the first die and the second die. The apparatus may be configured to start processing data by fixed logic circuits, transfer partially-processed data across the optical link to the to the first circuit die, and continue processing the data by the reconfigurable logic circuit.

According to another general aspect, a multi-chip module (MCM) may include a light source configured to generate an optical signal. The multi-chip module may include a logic circuit die comprising a fixed logic circuit, and configured to transmit data, in an optical fashion to a memory circuit die. The multi-chip module may include an interposer layer configured to couple the light source with the logic circuit die. The multi-chip module may include a memory circuit die configured to store a lookup table that receives the data. The multi-chip module may include an optical via coupled between the memory circuit die and the logical circuit die and configured to transfer data between the memory circuit die and the logic circuit die.

The details of one or more implementations are set forth in the accompanying drawings and the description below. Other features will be apparent from the description and drawings, and from the claims.

A system and/or method for computing technology, and more specifically to high-bandwidth memory (HBM) silicon photonic through-silicon-via (TSV) architecture for lookup computing artificial intelligence (AI) accelerator, substantially as shown in and/or described in connection with at least one of the figures, as set forth more completely in the claims.

BRIEF DESCRIPTION OF THE DRAWINGS

FIG. 2 is a block diagram of an example embodiment of a system in accordance with the disclosed subject matter.

FIG. 3 is a block diagram of an example embodiment of a system in accordance with the disclosed subject matter.

FIG. **4*a*** is a block diagram of an example embodiment of a system in accordance with the disclosed subject matter.

FIG. **4*b*** is a block diagram of an example embodiment of a system in accordance with the disclosed subject matter.

FIG. **4*c*** is a block diagram of an example embodiment of a system in accordance with the disclosed subject matter.

Figure 5:
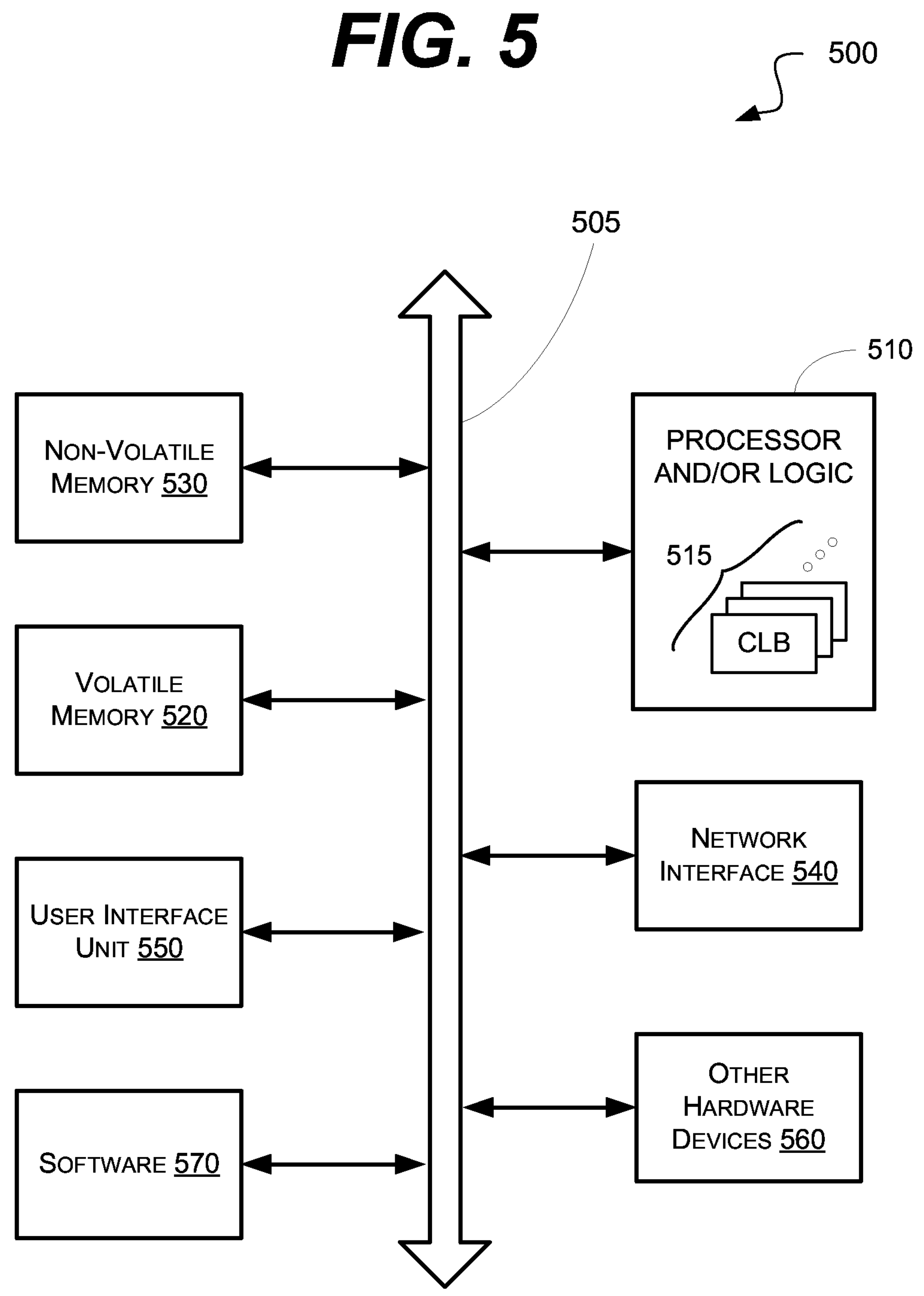

FIG. 5 is a schematic block diagram of an information processing system that may include devices formed according to principles of the disclosed subject matter.

Like reference symbols in the various drawings indicate like elements.

DETAILED DESCRIPTION

Various example embodiments will be described more fully hereinafter with reference to the accompanying drawings, in which some example embodiments are shown. The present disclosed subject matter may, however, be embodied in many different forms and should not be construed as limited to the example embodiments set forth herein. Rather, these example embodiments are provided so that this disclosure will be thorough and complete, and will fully convey the scope of the present disclosed subject matter to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, and so on may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosed subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

Likewise, electrical terms, such as "high" "low", "pull up", "pull down", "1", "0" and the like, may be used herein for ease of description to describe a voltage level or current relative to other voltage levels or to another element(s) or feature(s) as illustrated in the figures. It will be understood that the electrical relative terms are intended to encompass different reference voltages of the device in use or operation in addition to the voltages or currents depicted in the figures. For example, if the device or signals in the figures are inverted or use other reference voltages, currents, or charges, elements described as "high" or "pulled up" would then be "low" or "pulled down" compared to the new reference voltage or current. Thus, the exemplary term "high" may encompass both a relatively low or high voltage or current. The device may be otherwise based upon different electrical frames of reference and the electrical relative descriptors used herein interpreted accordingly.

The terminology used herein is for the purpose of describing particular example embodiments only and is not intended to be limiting of the present disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 1:
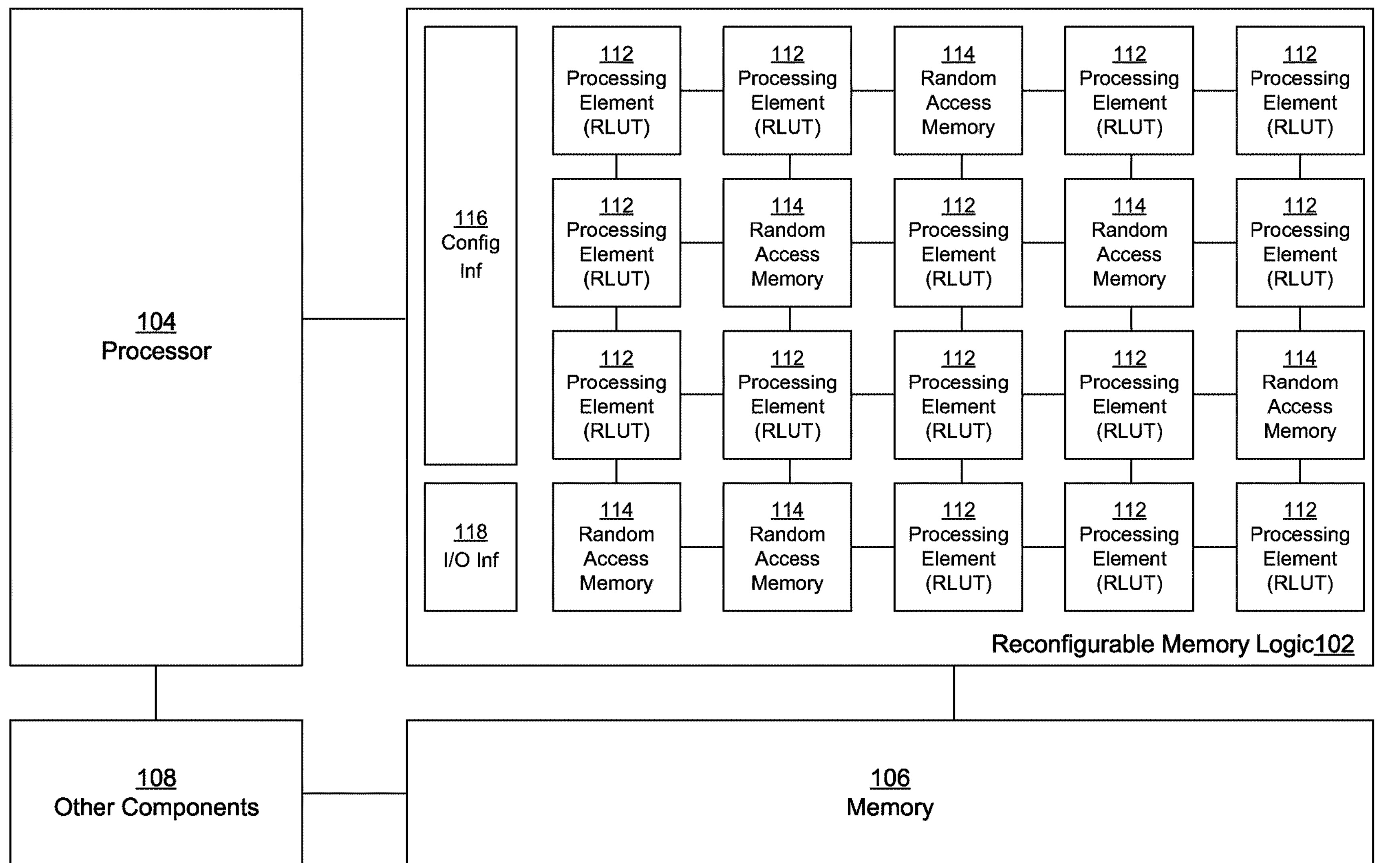
FIG. 1 is a block diagram of an example embodiment of a system in accordance with the disclosed subject matter.

FIG. 1 is a block diagram of an example embodiment of a system 100 in accordance with the disclosed subject matter. In various embodiments, the system 100 may include a processor 104, a memory 106, and a reconfigurable memory logic 102. In various embodiments, the system 108 may also include one or more other components 108 (e.g., a network interface, a memory controller, etc.).

In various embodiments, the system 100 may include a system on a chip (SoC). In some embodiments, for example that of FIGS. 2 and 3, the system 100 may include a number of integrated circuit (IC) dies, either separately or as part of a multi-chip module (MCM). In another embodiment, the system 100 may include a series of discrete or individual components. In yet another embodiment, the system 100 may include a combination of integrated and discrete components. In various embodiments, the system 100 may include a computing device, such as, for example, a laptop, desktop, workstation, personal digital assistant, smartphone, tablet, and other appropriate computers, etc. or a virtual machine or virtual computing device thereof. In various embodiments, the system 100 may be used by a user (not shown).

In the illustrated embodiment, the processor 104 may be configured to execute one or more machine executable instructions or pieces of software, firmware, or a combination thereof. In such an embodiment, the processor 104 may include fixed logic circuits (e.g., AND gates, flip-flops, etc.) that are set during the manufacture of the processor 104 (or shortly thereafter, e.g., fuses, etc.) and may not be substantially changed after manufacture. In another embodiment, the processor 103 may include a reconfigurable device, such as, for example a Field-programmable gate array (FPGA). It is understood that the above are merely a few illustrative examples to which the disclosed subject matter is not limited.

In various embodiments, the memory 106 may include a plurality of memory cells each configured to store one or more pieces of data, either temporarily, permanently, semi-permanently, or a combination thereof. The data in the memory 106 may be accessed by the processor 104. Further, the memory 106 may include volatile memory, non-volatile memory or a combination thereof.

In the illustrated embodiment, the system 100 may include a reconfigurable memory logic 102. The reconfigurable memory logic 102 may be similar to the memory 106 in that they may both include a number of memory cells (not explicitly shown) that are arranged in sub-arrays (illustrated as elements 112 and 114). Typically, a memory (e.g., an SRAM, a dynamic RAM (DRAM), etc.) includes an array of memory cells arranged into an array of rows and columns. Often, in order to make the larger array more manageable, the array may be divided into sub-arrays of memory cells (e.g., 256 rows by 256 columns, etc.). Traditionally, division of a memory array into sub-arrays may be advantageous because generally only one sub-array is accessed at a time, thus reducing power and computation complexity.

In the illustrated embodiment, the memory array (illustrated by the reconfigurable memory logic 102) may differ from the memory 106 in that the sub-arrays may be reconfigured to act as look-up tables (LUTs) instead of traditional memory sub-arrays. In such an embodiment, a logic function may be implemented in a LUT. For example, the LUT may perform an arithmetic logic function, such as that of an adder, multiplier, etc. It is understood that the above is merely one illustrative example to which the disclosed subject matter is not limited. In the illustrated embodiment, such LUTs may be referred to as processing elements or reconfigurable LUTs (RLUTs) 112.

In such an embodiment, once a given RLUT 112 is configured to accomplish certain a computation task (such as neural network processing), it is and acts as an accelerator or co-processor with respect to the processor 104, and its memory space may no longer be exposed for data storage to the processor 104. In such an embodiment, the processor 104 may off-load some kernels or tasks to be executed on this RLUT 112 stack, and once the task is completed the processor 104 may be interrupted or otherwise notified of the completed task. On the other hand, the RLUTs 112 may be configured as a pure memory stack for data storage, similar to the memory 106. In such an embodiment, the sub-arrays 112 and 114 may be reconfigurable as either memories or LUTs.

In such an embodiment, a RLUT 112 and the logic function implemented therein may be altered by merely performing a memory write operation. This may allow logic functions to be reconfigured or altered dynamically during the operation of the system 100. The use of a traditional write operation (or similar) may allow for reprogramming without the need of an unusual (i.e., non-operational or high) voltage, such as those used for programming EEPROMs, etc.

In such an embodiment, the reconfigurable memory logic 102 may include a configuration interface 116. In various embodiments, when the processor 104 (or other component) wishes to change or alter the logic function stored in the RLUT 112, it may perform a write operation or a special write operation (e.g., a write operation that includes an indicator that it involves a RLUT 112, etc.).

In some embodiments, all memory accesses or operations may pass through the reconfigurable memory logic 102's input/output (I/O) interface 118. In such an embodiment, if the memory access is to a sub-array that stores data for revival (e.g., a RAM sub-array 114, etc.), the I/O interface 118 may simply process the read/write request as a memory array traditionally would. However, in some embodiments, if the memory access is to a sub-array that is employed as a RLUT 112 (or will be employed as a RLUT 112), the I/O interface 118 may pass that memory access to the configuration interface 116 for processing.

In yet another embodiment, the I/O interface 118 may be configured to read or write to the RLUT 112. In such an embodiment, the write access may involve writing to the RLUT 112 to define the logical function thereof. In such an embodiment, the configuration interface 116 may be configured to adjust the routing of signals within or between the RLUT 112 or the reconfigurable memory logic 102 as a whole. For example, the configuration interface 116 may be configured to adjust the routing of signals between multiple RLUT 112 and/or the RAM 114*s*. In such an embodiment, the I/O interface 118 may be configured to manage data access to the RLUT 112*s* and RAMs 114, and the configuration interface 116 may be configured to manage the interconnects and routing of the sub-arrays 112 & 114. It is understood that the above are merely a few illustrative examples to which the disclosed subject matter is not limited. In various embodiments, the I/O interface 118 may include the configuration interface 116.

Further, in the illustrated embodiment, each sub-array may be utilized as either a RLUT 112 or as a traditional RAM 114 memory sub-array. As described above, a traditional RAM 114 sub-array may be configured to store data and information. In such an embodiment, the number of or balance between RLUTs 112 and RAM subarrays 114 may be dynamically adjusted within the reconfigurable memory logic 102 as desired. In another embodiment, the number of RLUTs 112 and RAM sub-arrays 114 may be fixed during manufacture. In yet another embodiment, a maximum number of RLUTs 112 may be fixed during manufacture but the RLUTs 112 may be configurable to operate as RAM sub-arrays 114. It is understood that the above are merely a few illustrative examples to which the disclosed subject matter is not limited.

In various embodiments, the processor 104 (or other component) may wish to configure a sub-array as a RLUT 112. In such an embodiment, the processor 104 may make a memory access to the reconfigurable memory logic 102. The memory access may include a write operation that stores a look-up table in a particular RLUT 112. The memory access may include a series of memory accesses depending upon the size of the LUT. In some embodiments, particular memory accesses may indicate the number of inputs to the LUT and the number of outputs from the LUT. In addition, further memory accesses may indicate signal routing information regarding the RLUT 112. For example, as described below, multiple RLUTs 112 may be cascaded or otherwise routed together to perform logical functions (e.g., an adder, etc.).

Conversely, the processor 104 (or other component) may wish to configure a sub-array as a RAM 114. In which case, the memory accesses may instruct the configuration interface 116 to re-configure the RLUT 112 back to a standard RAM 114. In some embodiments, a predefined memory cell may be configured to store a bit that indicates whether or not the sub-array is currently functioning as a RLUT 112 or a RAM 114. In various embodiments, that indication bit may be included in the sub-array or the configuration interface 116. It is understood that the above are merely a few illustrative examples to which the disclosed subject matter is not limited.

In various embodiments, the reconfigurable memory logic 102 may include dynamic RAM (DRAM). This may differ from the traditional FPGA or PLD technology in that the RLUT 112*s* may be reprogrammed by normal memory access operations and without the need to resort to special voltages (e.g., to burn fuses, or set transistors, etc.).

In such an embodiment, by basing the RLUTs 112 on DRAM subarrays a higher density may be archived, compared to an SRAM-based FPGA. For example, the DRAM RLUT 112 may require only one transistor and one capacitor (1T1C) per memory cell or bit of information, compared to the SRAM's need for six transistors (6T). In another embodiment, the DRAM RLUT 112*s* may result in a lower cost compared to SRAM or Flash-based FPGAs.

As the RLUT 112 may be modified by a traditional memory access (or a variant thereof), the RLUT 112 may be self-modifying. For example, the outputs of one clock-cycle's RLUT 112 computation may result in a memory access that re-configures or updates the RLUT 112 to perform a second computational function. In another embodiment, the outputs of a RLUT 112 may be feedback as inputs to the same RLUT 112 in a way that modifies the RLUT 112's behavior.

In addition, in various embodiments, the co-mingling of the DRAM RLUTs 112 and RAMs 114 may provide advantages. For example, the close proximity to the data stored in the RAM 114, may speed the computation performed by the RLUT 112, and lower the power requirements as data need not be moved across busses. In some embodiments, by basing the RLUT 112 upon DRAM-technology similar to that used to create the processor 104 and memory 106, the RLUT 112*s* may exist within the same die or package as the processor 104 and/or memory 106. As such, the near-data computing provided by the DRAM RLUT 112*s* may be faster and more efficient. In addition, the same manufacturing process may lower the cost of the production of system 100. It is understood that the above are merely a few illustrative examples to which the disclosed subject matter is not limited.

Figure 2:
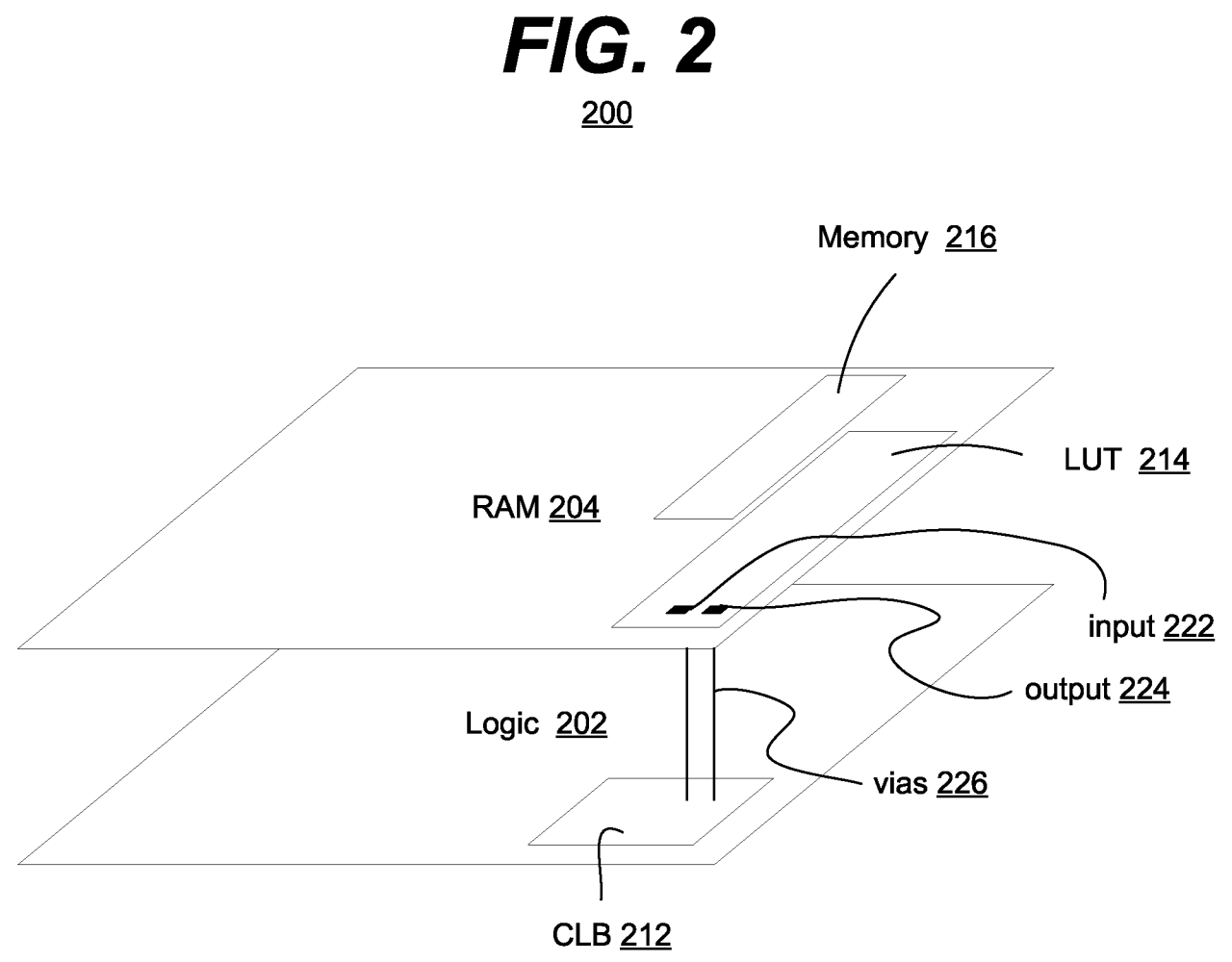

FIG. 2 is an isometric block diagram of an example embodiment of a system 200 in accordance with the disclosed subject matter. In the illustrated embodiment, a number of integrated circuit dies may be stacked (or otherwise) integrated to form a multi-chip module or system. In various embodiments, this multi-chip system 200 may include an RLUT, as described above, or a more traditional look-up table (LUT).

In various embodiments, a High Bandwidth Memory (HBM) may include a high-performance form of random access memory (RAM). In some embodiments, HBM may include stacked dynamic RAM (DRAM) memory that communicates using through-silicon vias (TSV). Generally, High Bandwidth Memory combines through-silicon vias (TSV) and micro-bumps to connect multiple (e.g., 4, 8, etc.) dies of memory cell arrays on top of each other. In some embodiments, a memory controller (not shown) may be included on a separate die at the very bottom of the stack.

In various embodiments, the system 200 may include a High Bandwidth Memory. In such an embodiment, the system 200 may include a memory controller (not shown), which may be placed at the top or bottom of the stack, or otherwise, depending upon the embodiment. It is understood that the above is merely one illustrative example to which the disclosed subject matter is not limited.

In the illustrated embodiment, the system 200 may include a memory (e.g., DRAM, etc.) die 204 and a logic die 202. In the illustrated embodiment, the memory die 204 may include a number of memory arrays 216. In such an embodiment, the memory arrays 216 may be configured to store various pieces of data.

In the illustrated embodiment, the memory die 204 may include one or more look-up tables (LUTs) 214 or even reconfigurable LUTs (RLUTs). In such an embodiment, the LUTs 214 may include a memory sub-array that has been configured to store a look-up table that is capable of performing a given logic function, as described above.

In various embodiments, the memory die 204 may include a plurality of memory cells 216. In such an embodiment, the LUT 214 may be configured to access data stored either within the memories 216 of the memory die 204. In such an embodiment, the LUT 214 may be co-located or physically proximate to the accessed memory 216. In such an embodiment, the connection between the two, both in terms of access time and power, may be reduced. Further, the routing required between the two may be reduced. It is understood that the above is merely one illustrative example to which the disclosed subject matter is not limited.

In various embodiments, the logic die 202 may include a processor (e.g., a central processor, a graphical processor) configured to execute instructions or logical operations. In the illustrated embodiment, the logic die 202 may include a plurality of logic circuits or combinatorial logical blocks (CLBs) 212. CLBs 212 generally includes circuits to perform Boolean algebra on input signals and on stored data, and as a practical matter normally contain a mixture of combinational (e.g., NAND and NOR gates) and sequential (e.g., flip-flops, latches) logic.

In various embodiments, the LUT 214 may communicate with the logic die 202 (e.g., CLB 212) using one or more vias 226. In such an embodiment, this may allow high speed communication between the two processing elements (e.g., LUT 212 and CLB 212) without the need for communication over a bus or an external interface.

In various embodiments, the vias 226 may include an optical via, such as, for example, a through-silicon-photonic-via (TSPV), an optical fiber, an optical waveguide, or an optical coupler. In such an embodiment, if the LUT 214 and CLB 212 include electrical circuits, an electrical-to-optical transducer may be needed at the input 222 of the via 226. Likewise, optical-to-electrical transducer may be needed at the output 224 of the via 226.

In one such embodiment, the CLB 212 may be processing an instruction, and generate the first set of data (an output from the CLB 212). The logic 202 die may determine that the next stage of processing may more efficiently (e.g., in terms of speed, bandwidth, power) be carried out by the LUT 214, and may instruct the CLB 212 to transfer the data to the LUT 214 for processing.

In such an embodiment, the CLB 212 may transfer the first data to the LUT 214 across the optical via 226. In such an embodiment, the optical via 226 or the accompanying components may perform electrical/optical conversions as needed.

The LUT 214 may process the first data or execute an instruction upon the first data, producing a second set of data (the output of the LUT 214). The LUT 214 may then transfer this second data back to the logic die 202 to the same or a different CLB 212 for further processing. Again, the data may be transferred across the optical via 226.

In various embodiments, the LUT 214 may generate the first data and transfer it to the CLB 212 for further processing (generating the second data). In such an embodiment, the operations may be the inverse of those described above.

In another embodiment, the LUT 214 may make use of data stored in the memory 216, either as inputs in addition to the data from the CLB 212 or as the sole input to the LUT 214. In yet another embodiment, the output of the LUT 214 may be stored in the memory 216 instead of being transferred back to the CLB 212. Or, the data may be copied to the memory 216 in addition to, at least partially, being transferred to the CLB 212. In various embodiments, the optical vias 226 may be employed to read/write data from the memories 216. It is understood that the above are merely a few illustrative examples to which the disclosed subject matter is not limited.

In various embodiments, the processing speed for certain operations (e.g., matrix multiplication, matrix convolution) may be limited by the internal bandwidth or speed at which data may be moved. As such, in the illustrated embodiment, the ability to move data between the dies 202 and 204 using an optical via 226 may greatly increase processing speed.

In one embodiment, the photonic link or optical via 226 may enable much higher bandwidth density than a traditional electrical link. For example, the optical via 226 may reach a bandwidth or speed of 128 Gb/s (gigabytes per second), compared to an electrical link's speed of 64 Gb/s. In various embodiments, this may be done through Dense Wave Division Multiplexing (DWDM), thus allowing a higher bandwidth (compared to an electrical link) given the substantially same silicon footprint. It is understood that the above is merely one illustrative example to which the disclosed subject matter is not limited.

In various embodiments, a plurality of memory dies 204 may be included in the system 200. In such an embodiment, the memory dies may be stacked upon or atop one another. In some embodiments, only a sub-set of memory dies 204 may include LUTs 214. In another embodiment, the multiple optical vias 226 may be employed, which directly connect the logic die 202 with a particular respective one of the stacked memory dies 204. In yet another embodiment, optical vias 226 may be employed, which directly connect the one stacked memory die 204 to another stacked memory die 204.

FIG. 3 is a block diagram of an example embodiment of a system 300 in accordance with the disclosed subject matter. In the illustrated embodiment, a number of integrated circuit dies may be stacked (or otherwise) integrated to form a multi-chip module or system. In the illustrated embodiment, the components related to the optical vias are focused upon.

In the illustrated embodiment, the system 300 may include a memory die 304 and a logic die 302, as described above. In addition, in such an embodiment, the system 300 may also include a light source 390. The light source 390 may generate or otherwise provide the light employed by the optical vias. In various embodiments, two or more of the dies 302, 304, or 390 may be coupled by an interposer layer 301.

In the illustrated embodiment, the dies 302 and 304 may be connected by three elements. The light source link 356 may couple the light source 390 with the optical elements (e.g., modulator 322) of the memory die 304, as described below. The address/command link or via 354 may transfer address and command data. In various embodiments, the address/command via 354 may be optical or electrical. In such an embodiment, the bandwidth required for the lesser amount of information transmitted for address and commend information may allow the via 354 to be electrical. In another embodiment, the address/command via 354 may be optical. In the illustrated embodiment, the data link or via 352 may be optical, as described above. In various embodiments, the links 352, 354, and 356 may include optical waveguides.

The transfer of data from the memory die 304 to the logic die 302 is discussed. In the illustrated embodiment, the memory die 304 may include a look-up table (LUT) 334 configured to perform a logical operation or function by taking in a first set of data and outputting a second set of data, as described above. The memory die 304 may include an intermediate results buffer, memory or circuit 336 configured to store the first or second data.

In the illustrated embodiment, the memory die 304 may include a driver circuit 328 configured to receive an electrical version of second data, and drive or produce a version of the second data with enough electrical power to be converted by the modulator 322. In such an embodiment, the memory die 304 may include the optical modulator 322 configured to convert an electrical signal (e.g., the second data) to an optical signal. In such an embodiment, the modulator 322 may take the light source or signal generated by the light source 390 (and routed to the modulator 322 by the light source link 356), and vary or modulate the light source according to, at least in part, the electrical version of data received from the driver 328. This optical version of the data may then be transmitted across or by the data link or via 352 to the logic die 302.

In the illustrated embodiment, the logic die 302 may include an optical filter and/or detector 324. The optical detector 324 may be configured to detect the optical data transmitted across waveguide portion of the optical via (e.g., data via 352), and convert the optical data to electrical data. The logic die 302 may include an amplifier circuit 326 configured to provide electrical gain or power to the received electrical data (e.g., the second data). The logic die 302 may include a computational or combinatorial logic 322, as described above, which may receive the data and further process it.

In various embodiments, the transmission of data from the logic die 302 to the memory die 304 may work in a similar fashion but in reverse. In such an embodiment, the logic die 302 may include its own versions of the driver circuit 328 and optical modulator 322. In such an embodiment, the logic die 302's optical modulator 322 may be coupled with the light source 390 across the interposer 301. The memory die may include its own versions of the optical filter and/or detector 324, and amplifier circuit 326, as described above.

In the illustrated embodiment, the logic die 302 may include a scheduler circuit 340 configured to coordinate inter-die data traffic across the optical via(s) 352 and/or 354. In various embodiments, the scheduler circuit 340 may determine when a certain operation or logic function should be performed by the CLB 332 or the LUT 334. In various embodiments, the scheduler circuit 304 may determine if data should be transferred across an optical link 352 or an electrical link (e.g., an electrical version of link 354). It is understood that the above are merely a few illustrative examples to which the disclosed subject matter is not limited.

In the illustrated embodiment, the LUT 334, intermediate results buffer 336, amplifier 326, driver 328, CLB 332, and scheduler 340 may be electrical components. Conversely, in the illustrated embodiment, the optical modulator 322, the optical detector 324 and the light source 390 may be, at least primarily, optical components. It is understood that the above are merely a few illustrative examples to which the disclosed subject matter is not limited.

FIG. **4*a* is a block diagram of an example embodiment of a system 491 in accordance with the disclosed subject matter. In the illustrated embodiment, the system 491** may include the memory die, as described above. In the illustrated embodiment, a memory bank-level of granularity of the access to the various memory cells or elements of the memory die are discussed.

In the illustrated embodiment, the system 491 may include a plurality of memory mats 490 (shown with the memory cells and row & column decoders). These mats 490 may be arranged into memory banks 420. In various embodiments, the system 491 may include a plurality of memory banks 420.

In this context, a memory mat 490 may be building block of a memory bank 420. Multiple mats 490 in a memory bank 420 may operate simultaneously to fulfill a memory operation (e.g., read, write). Each memory mat 490 may include one or more subarrays or memory cells, and decoder blocks (e.g., row and column). It is understood that the above are merely a few illustrative examples to which the disclosed subject matter is not limited.

In the illustrated embodiment, the memory mats 490 may be communicatively coupled with the optical via or waveguide 402 by a bus network 404. In such an embodiment, the whole of the memory bank 420, and the data therein, may be selected to be read from (source) or written to (target or destination) the optical via or waveguide 402.

In such an embodiment, when the memory bank 420 is acting as a source or being read from, the memory bank 420's data may be stored in the buffer circuit 416. It may then be serializer, at least in part, by the serializer circuit 414 that converts the parallel data to a serial form. The electrical drive 412 may then provide the electrical form of the data with sufficient gain or power. The system 491 may include the buffer circuit 416, the serializer circuit 414, and the electrical driver 412.

In the illustrated embodiment, the light source 406 may then be modulated by the micro-ring modulators 404. This may be done according to the electrical form of the data, such that the electrical data is transformed into optical data. In the illustrated embodiment, four micro-ring modulators 404, each associated with a different wavelength (λ) or color are shown. It is understood that the above is merely one illustrative example to which the disclosed subject matter is not limited. The now optical version of the data is transmitted across the optical via or waveguide 402.

Figure 4A:
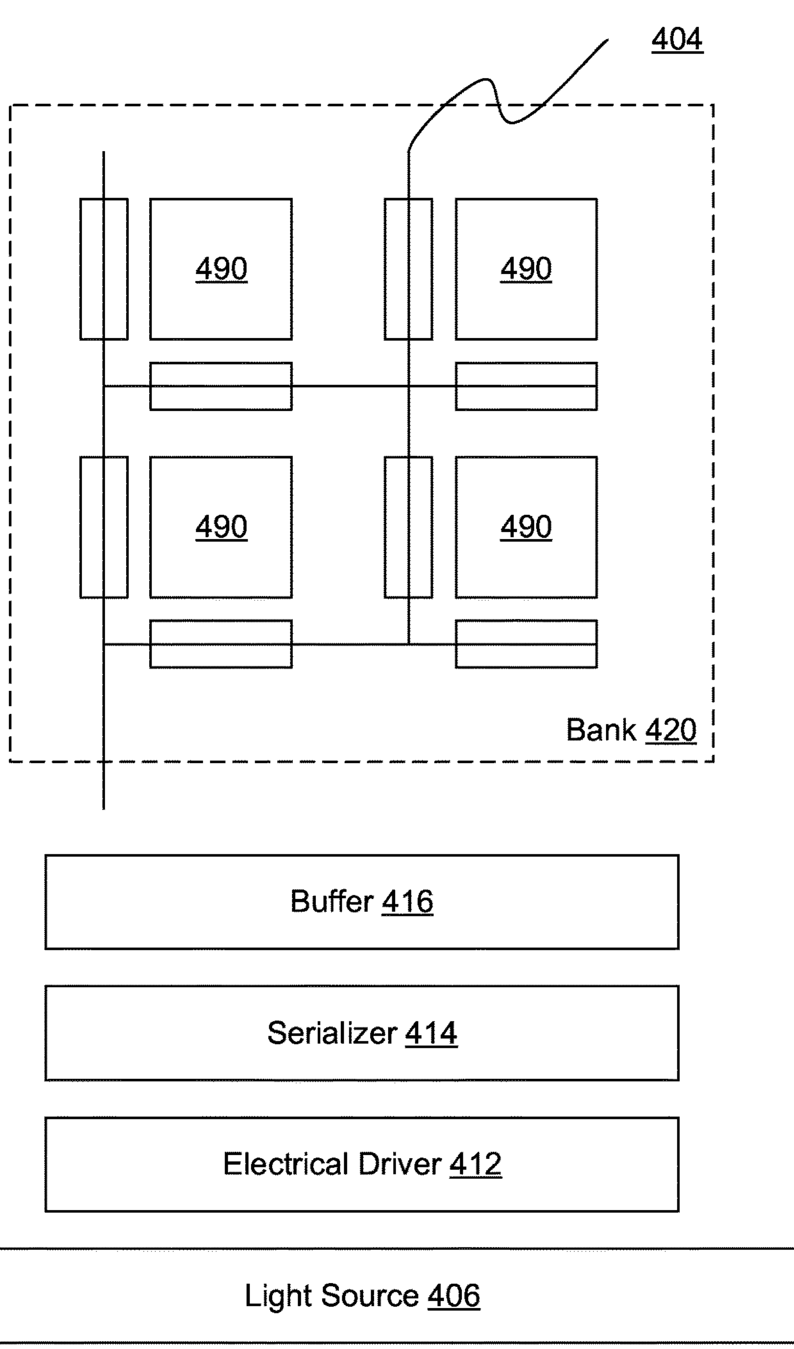
Figure 4A:
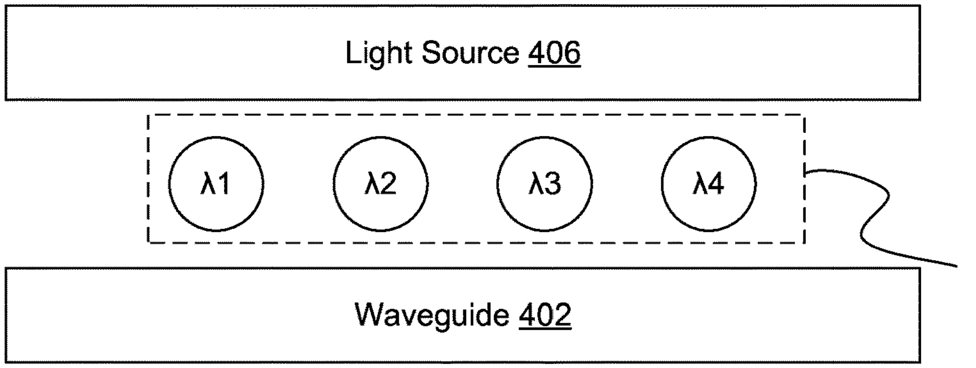
Figure 4B:
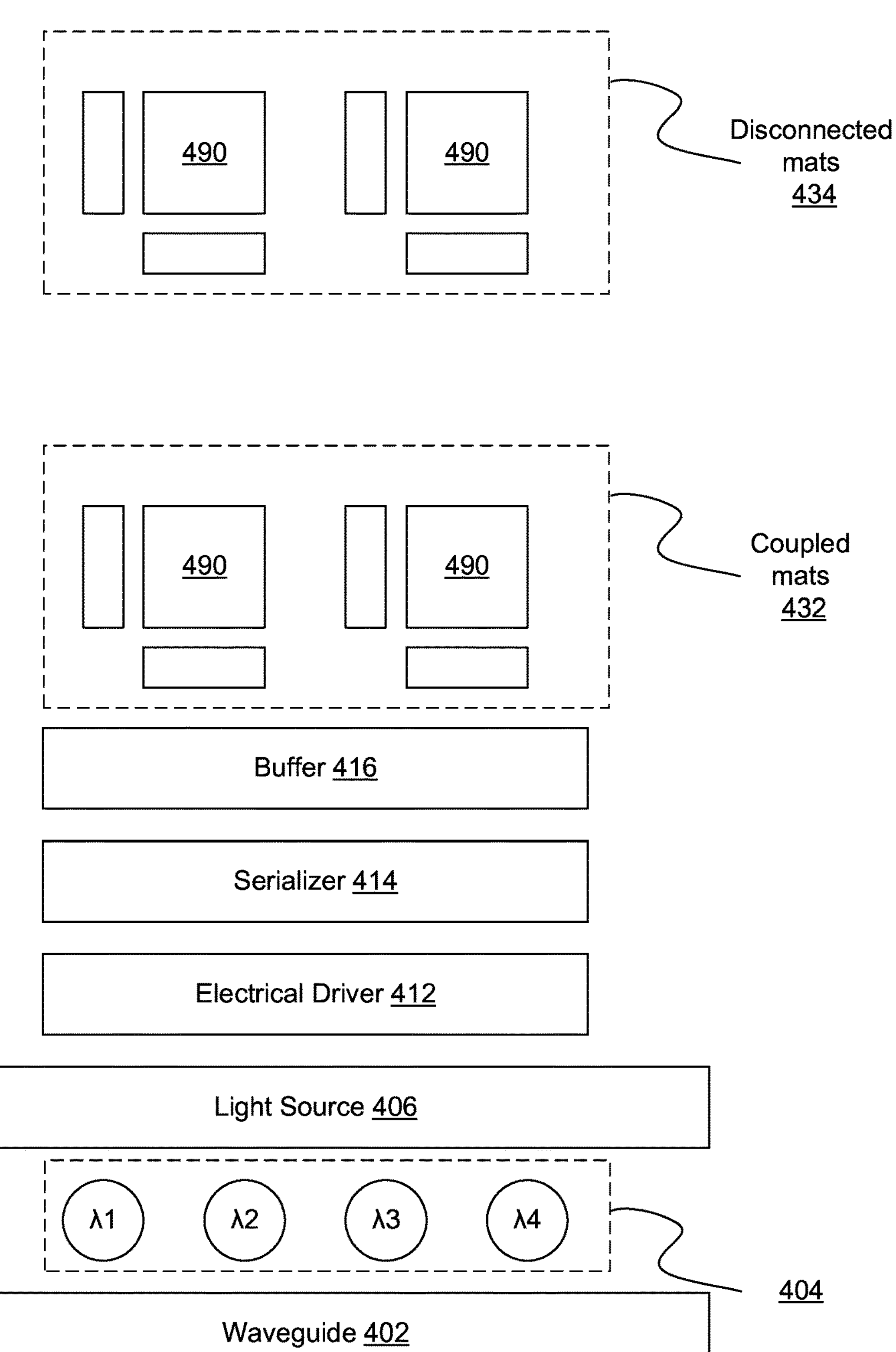

FIG. 4*b* is a block diagram of an example embodiment of a system 492 in accordance with the disclosed subject matter. In the illustrated embodiment, the system 492 may include the memory die, as described above. In the illustrated embodiment, a memory mat-level of granularity of the access to the various memory cells or elements of the memory die are discussed.

In the illustrated embodiment, the system 491 may include a plurality of memory mats 490 (shown with the memory cells and row & column decoders), as described above. In the illustrated embodiment, the memory mats 490 may be grouped into mats 432 which are coupled with or have access to the optical via or waveguide 402, and those mats 434 that do not or are disconnected or un-connected from the optical via or waveguide 402.

In the illustrated embodiment, the each of the memory mats 432 may be directly communicatively coupled with the optical via or waveguide 402. In such an embodiment, data may be transferred to particular memory mat 490*s* and not to large groups of them (e.g., memory banks). In various embodiments, each connected memory mat 432 may be associated with a respective modulation technique or form (e.g., wavelength, color, and so on).

In such an embodiment, when a connected memory mat 432 is acting as a source or being read from, the memory mats 490's data may be stored in the buffer circuit 416. It may then be serialized, at least in part, by the serializer circuit 414 that converts the parallel data to a serial form. The electrical drive 412 may then provide the electrical form of the data with sufficient gain or power. The system 491 may include the buffer circuit 416, the serializer circuit 414, and the electrical driver 412.

In the illustrated embodiment, the light source 406 may then be modulated by the micro-ring modulators 404. This may be done according to the electrical form of the data, such that the electrical data is transformed into optical data. In the illustrated embodiment, four micro-ring modulators 404, each associated with a different wavelength (λ) or color are shown. It is understood that the above is merely one illustrative example to which the disclosed subject matter is not limited. The now optical version of the data is transmitted across the optical via or waveguide 402.

Figure 4C:
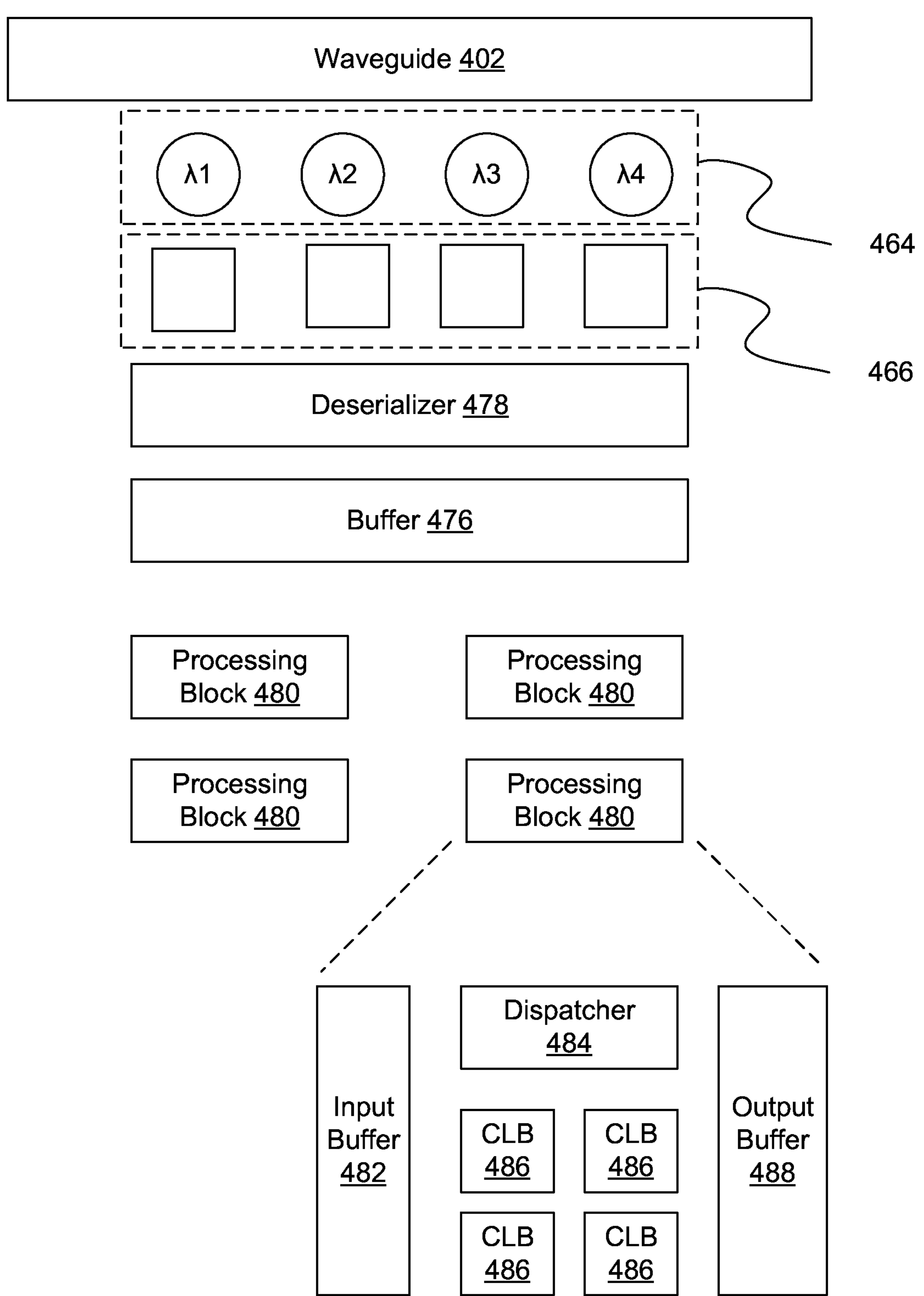

FIG. 4*c* is a block diagram of an example embodiment of a system in accordance with the disclosed subject matter. In the illustrated embodiment, the system 493 may include the logic die, as described above. In the illustrated embodiment, the receival side of the optical via is described. It is understood that both the logic and memory dies include their respective versions of the receival and transmittal portions of the optical via interfaces.

In the illustrated embodiment, data may be transmitted across the optical via or waveguide 402. The data may be received or filtered by the micro-ring filters 464. The system 493 may include a plurality of optical or photo-detectors 466. In various embodiments, each photo-detector 466 may be associated with a respective micro-ring filter 464. In the illustrated embodiment, four micro-ring filters 464 and photo-detectors 466, each associated with a different wavelength (λ) or color are shown. It is understood that the above is merely one illustrative example to which the disclosed subject matter is not limited. The photo-detectors 466 may convert the optical signal or data to an electrical signal or data, as described above.

In the illustrated embodiment, the system 493 may include a deserializer circuit 478. The deserializer circuit 478 may be configured to convert the received signal or data from a serial form to a parallel form. The system 493 may include a buffer circuit 476 to store the data. The data may then be sent or received by a target or destination processing block 480.

In various embodiments, each processing block 480 may include an input buffer 482 and/or output buffer 488 (e.g., flip-flops), one or more CLBs 486, and a dispatcher circuit 484. In various embodiments, the dispatcher circuit 484 may be configured to read/write data from the buffer circuits (e.g., buffer 476). As described above, the system 493 may include a transmittal interface to the optical via similar to that shown in FIGS. 4*a* and 4*b*. This transmittal interface (not shown) may include its own buffer circuit (similar to buffer 416) which the dispatcher circuit 484 may write to.

FIG. 5 is a schematic block diagram of an information processing system 500, which may include semiconductor devices formed according to principles of the disclosed subject matter.

Referring to FIG. 5, an information processing system 500 may include one or more of devices constructed according to the principles of the disclosed subject matter. In another embodiment, the information processing system 500 may employ or execute one or more techniques according to the principles of the disclosed subject matter.

In various embodiments, the information processing system 500 may include a computing device, such as, for example, a laptop, desktop, workstation, server, blade server, personal digital assistant, smartphone, tablet, and other appropriate computers or a virtual machine or virtual computing device thereof. In various embodiments, the information processing system 500 may be used by a user (not shown).

The information processing system 500 according to the disclosed subject matter may further include a central processing unit (CPU), logic, or processor 510. In some embodiments, the processor 510 may include one or more functional unit blocks (FUBs) or combinational logic blocks (CLBs) 515. In such an embodiment, a combinational logic block may include various Boolean logic operations (e.g., NAND, NOR, NOT, XOR), stabilizing logic devices (e.g., flip-flops, latches), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 500 according to the disclosed subject matter may further include a volatile memory 520 (e.g., a Random Access Memory (RAM)). The information processing system 500 according to the disclosed subject matter may further include a non-volatile memory 530 (e.g., a hard drive, an optical memory, a NAND or Flash memory). In some embodiments, either the volatile memory 520, the non-volatile memory 530, or a combination or portions thereof may be referred to as a "storage medium". In various embodiments, the volatile memory 520 and/or the non-volatile memory 530 may be configured to store data in a semi-permanent or substantially permanent form.

In various embodiments, the information processing system 500 may include one or more network interfaces 540 configured to allow the information processing system 500 to be part of and communicate via a communications network. Examples of a Wi-Fi protocol may include, but are not limited to, Institute of Electrical and Electronics Engineers (IEEE) 802.11g, IEEE 802.11n. Examples of a cellular protocol may include, but are not limited to: IEEE 802.16m (a.k.a. Wireless-MAN (Metropolitan Area Network) Advanced, Long Term Evolution (LTE) Advanced, Enhanced Data rates for GSM (Global System for Mobile Communications) Evolution (EDGE), Evolved High-Speed Packet Access (HSPA+). Examples of a wired protocol may include, but are not limited to, IEEE 802.3 (a.k.a. Ethernet), Fibre Channel, Power Line communication (e.g., HomePlug, IEEE 1901). It is understood that the above are merely a few illustrative examples to which the disclosed subject matter is not limited.

The information processing system 500 according to the disclosed subject matter may further include a user interface unit 550 (e.g., a display adapter, a haptic interface, a human interface device). In various embodiments, this user interface unit 550 may be configured to either receive input from a user and/or provide output to a user. Other kinds of devices may be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

In various embodiments, the information processing system 500 may include one or more other devices or hardware components 560 (e.g., a display or monitor, a keyboard, a mouse, a camera, a fingerprint reader, a video processor). It is understood that the above are merely a few illustrative examples to which the disclosed subject matter is not limited.

The information processing system 500 according to the disclosed subject matter may further include one or more system buses 505. In such an embodiment, the system bus 505 may be configured to communicatively couple the processor 510, the volatile memory 520, the non-volatile memory 530, the network interface 540, the user interface unit 550, and one or more hardware components 560. Data processed by the processor 510 or data inputted from outside of the non-volatile memory 530 may be stored in either the non-volatile memory 530 or the volatile memory 520.

In various embodiments, the information processing system 500 may include or execute one or more software components 570. In some embodiments, the software components 570 may include an operating system (OS) and/or an application. In some embodiments, the OS may be configured to provide one or more services to an application and manage or act as an intermediary between the application and the various hardware components (e.g., the processor 510, a network interface 540) of the information processing system 500. In such an embodiment, the information processing system 500 may include one or more native applications, which may be installed locally (e.g., within the non-volatile memory 530) and configured to be executed directly by the processor 510 and directly interact with the OS. In such an embodiment, the native applications may include pre-compiled machine executable code. In some embodiments, the native applications may include a script interpreter (e.g., C shell (csh), AppleScript, AutoHotkey) or a virtual execution machine (VM) (e.g., the Java Virtual Machine, the Microsoft Common Language Runtime) that are configured to translate source or object code into executable code which is then executed by the processor 510.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

In various embodiments, a computer readable medium may include instructions that, when executed, cause a device to perform at least a portion of the method steps. In some embodiments, the computer readable medium may be included in a magnetic medium, optical medium, other medium, or a combination thereof (e.g., CD-ROM, hard drive, a read-only memory, a flash drive). In such an embodiment, the computer readable medium may be a tangibly and non-transitorily embodied article of manufacture.

While the principles of the disclosed subject matter have been described with reference to example embodiments, it will be apparent to those skilled in the art that various changes and modifications may be made thereto without departing from the spirit and scope of these disclosed concepts. Therefore, it should be understood that the above embodiments are not limiting but are illustrative only. Thus, the scope of the disclosed concepts is to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. An apparatus comprising:

a first circuit die comprising a configurable logic circuit;

a second circuit die comprising one or more logic circuits configured to transform input data to first data, wherein the input data is received at the second circuit die; and a communication path coupled between the first circuit die and the second circuit die and configured to transfer the first data between the first circuit die and the second circuit die;

wherein the apparatus is configured to determine a performance of the configurable logic circuit, and transfer, based on the performance, the first data, using the communication path, to the first circuit die, and process the first data using the configurable logic circuit.

2. The apparatus of claim 1, wherein the second circuit die comprises a driver circuit configured to receive the first data, wherein driver circuit is coupled to the communication path.

3. The apparatus of claim 1, wherein the first circuit die comprises:

a detector configured to detect data transmitted using the communication path; and an amplifier circuit coupled between the detector and the configurable logic circuit.

4. The apparatus of claim 1, wherein the configurable logic circuit comprises at least one memory mat arranged in a memory bank; and wherein the communication path is coupled to the memory bank.

5. The apparatus of claim 1, wherein the configurable logic circuit comprises a memory mat; and wherein the communication path is communicatively coupled to the memory mat, wherein the memory mat is associated with a form of modulation such that a data transfer using the form of modulation is directed to the memory mat.

6. The apparatus of claim 1, wherein the second circuit die comprises a scheduler circuit configured to coordinate data traffic using the communication path.

7. The apparatus of claim 1, wherein the communication path comprises a via; and wherein the configurable logic circuit comprises a lookup table.

* * * * *